United States Patent [19]

Nishizawa et al.

[11] Patent Number: 4,531,156
[45] Date of Patent: Jul. 23, 1985

[54] SOLID STATE IMAGE PICKUP DEVICE

[75] Inventors: Jun-ichi Nishizawa, No. 6-16, 1-Chome, Komegafukuro, Sendai City, Miyagi Pref., Japan; Sohbe Suzuki; Takashige Tamamushi, both of Sendai; Yasuo Arisawa, Matsumoto, all of Japan

[73] Assignees: Olympus Optical Company Limited; Jun-ichi Nishizawa, both of Japan

[21] Appl. No.: 556,993

[22] Filed: Dec. 1, 1983

[30] Foreign Application Priority Data

Dec. 14, 1982 [JP] Japan .................. 57-217752

[51] Int. Cl.³ .............................................. H04N 3/11
[52] U.S. Cl. .................... 358/213; 358/212; 358/209; 357/24
[58] Field of Search ............. 357/24 LR, 22, 30; 250/578; 359/209, 212, 213, 41

[56] References Cited

U.S. PATENT DOCUMENTS

| 4,013,315 | 6/1977 | Pfleiderer | 358/212 |
| 4,399,464 | 8/1983 | Hix et al. | 358/213 |
| 4,427,990 | 1/1984 | Nishizawa | 357/22 |
| 4,472,744 | 9/1984 | Inoue et al. | 358/293 |

Primary Examiner—Gene Z. Rubinson
Assistant Examiner—Robert Lev
Attorney, Agent, or Firm—Parkhurst & Oliff

[57] ABSTRACT

A solid state image pickup device having an electronic shutter function is disclosed. The device comprises a plurality of picture cells each having a static induction transistor and arranged in a matrix, a plurality of vertical and horizontal scanning lines for scanning the cells, vertical and horizontal registers for generating scanning pulses which drive the vertical and horizontal scanning lines, a readout signal line for reading out light information stored in the cells, a reset signal line for resetting the cells, and a shutter speed control circuit for optionally setting in one frame period the timing of reset scanning pulses generated from a vertical register.

10 Claims, 15 Drawing Figures

FIG. 1
PRIOR ART
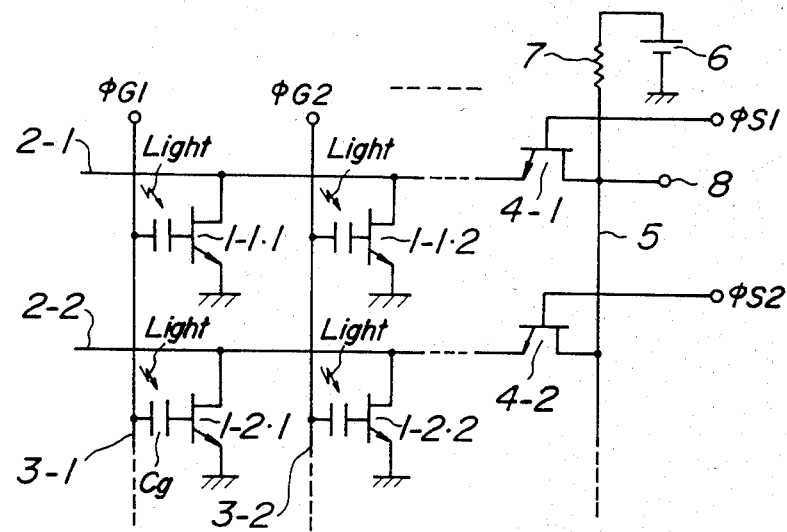
FIG. 2a
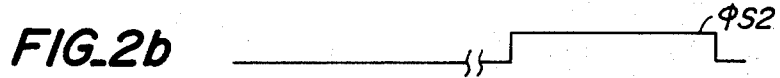
FIG. 2b
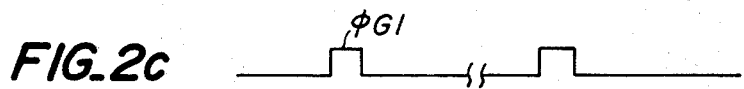
FIG. 2c
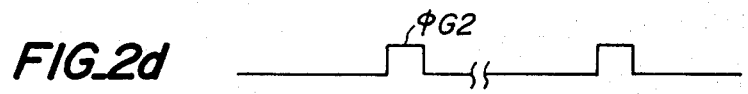
FIG. 2d

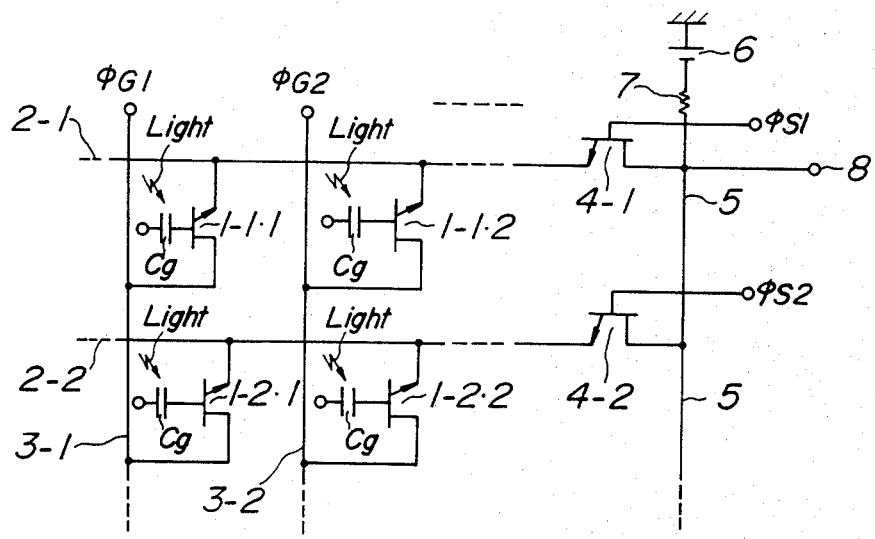
FIG_3
*PRIOR ART*
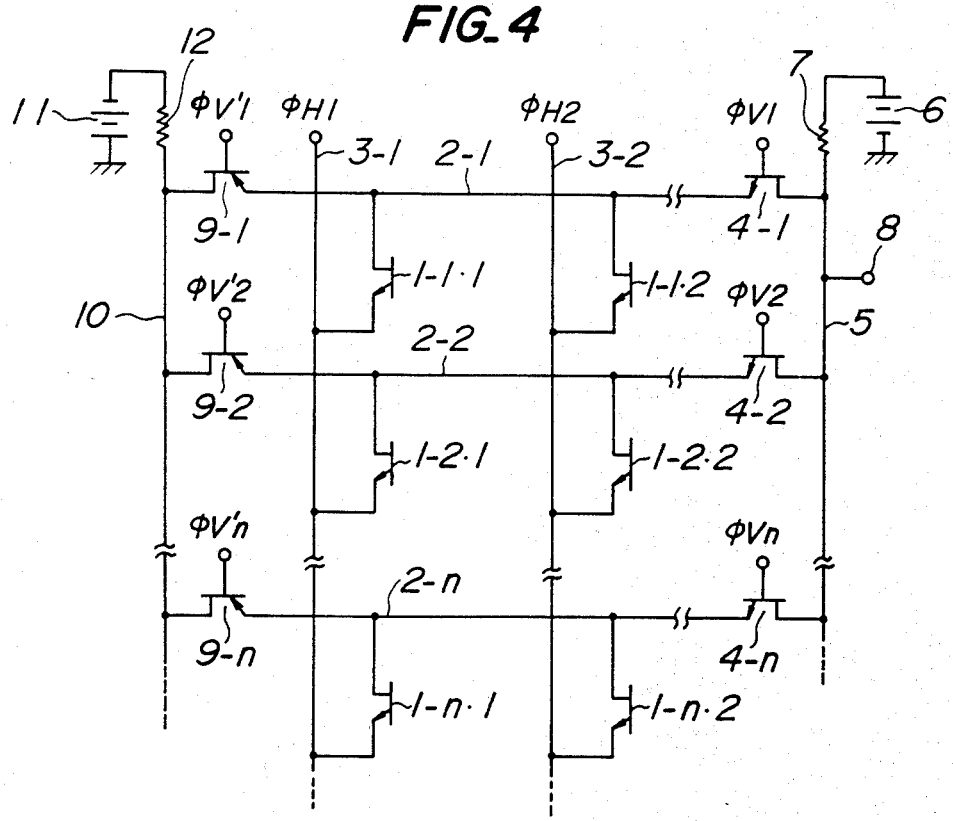
FIG_4

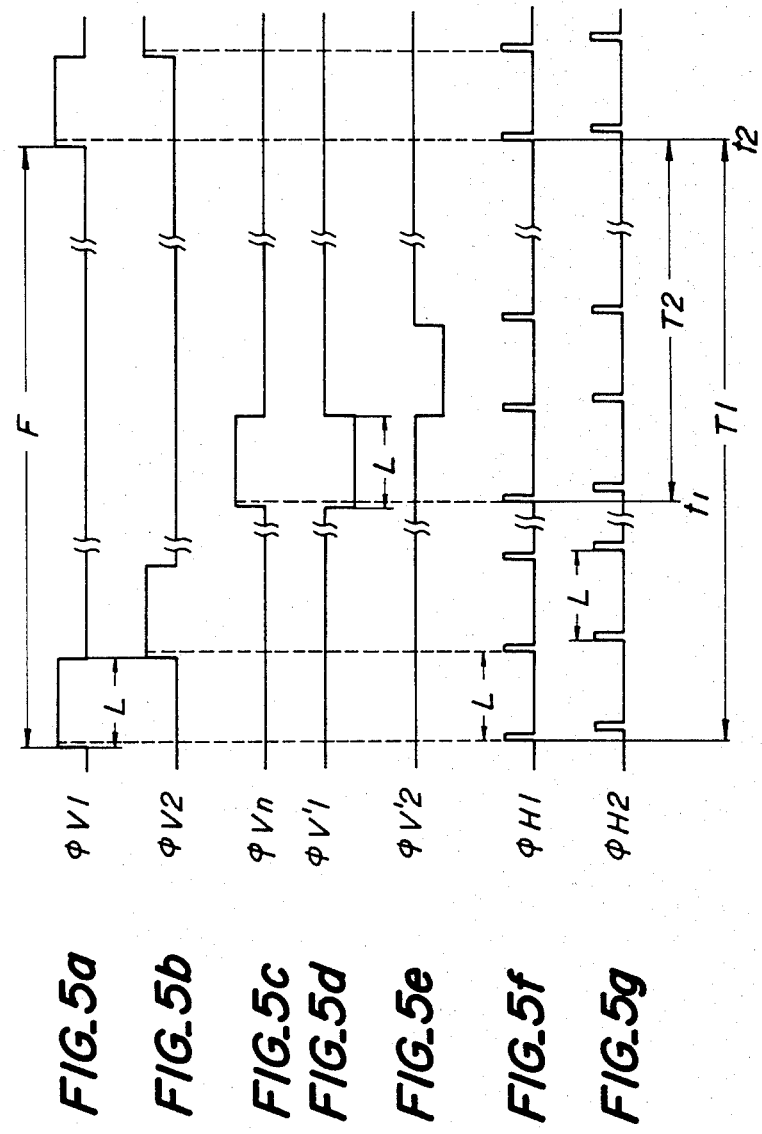

SOLID STATE IMAGE PICKUP DEVICE

BACKGROUND OF THE INVENTION

The present invention relates to a solid state image pickup device having a shutter function and by utilizing a static induction transistor as a solid state imaging element.

There has been widely used a solid state image pickup device comprising a charge coupled device or an MOS transistor. The present tendency is to replace these elements by a static induction transistor (hereinafter referred to as SIT element).

As an example FIG. 1 shows a circuit arrangement of a solid state image pickup device constructed by arranging in a matrix a plurality of isolated gate SIT elements. FIG. 2 shows a waveform chart for explaining the operation of the isolated gate SIT arranged in a matrix as shown in FIG. 1. Respective SIT elements 1-1.1, 1-1.2, ..., 1-2.1, 1-2.2, ... are of an n channel SIT of normal OFF type and form a picture cell. Each picture cell receives light inputs and generates video signal outputs which are read out by an XY address system. As shown in FIG. 1 respective SIT elements 1-1.1, 1-1.2, ..., 1-2.1, 1-2.2, ... have source electrodes which are connected to respective vertical scanning lines 2-1, 2-2, ..., drain electrodes which are connected to a reference voltage source (in the shown embodiment, grounded voltage) and gate electrodes which are connected to respective horizontal scanning lines 3-1, 3-2, ..... The horizontal scanning lines 3-1, 3-2, ... are successively selected by signals $\emptyset G_1$, $\emptyset G_2$, ... generated from a horizontal register (not shown). The vertical scanning lines 2-1, 2-2, ... are successively selected and connected to a readout signal line 5 through respective line selection switches 4-1, 4-2, ... which are made conductive by signal $\emptyset S_1$, $\emptyset S_2$ ... generated from a vertical register (not shown) during selected period of one horizontal scanning line.

When the signal $\emptyset S_1$ having a duration equal to one line scanning period shown in FIG. 2a is supplied to the line selection switch 4-1 of the vertical scanning line 2-1 from the vertical register, the line selection switch 4-1 becomes conductive and source and drain electrodes of respective SIT elements 1-1.1, 1-1.2, ... corresponding to respective picture cells in the horizontal direction are biased to a certain voltage during one line scanning period. Under this condition, when the signal $\emptyset G_1$ shown in FIG. 2c is supplied to the horizontal scanning line 3-1 from the horizontal register, the SIT element 1-1.1 is selected so that the current equivalent to the charges caused by light, stored in a gate capacitance $C_g$ of SIT element 1-1.1 and having an amount corresponding to an amount of incident light, flows through a load resister 7, the transistor switch 4-1, and the SIT element 1-1.1 from a power supply source 6. As a result of this the variable component of the voltage drop generated in the load resistor 7 is obtained at an output terminal 8 as an output voltage corresponding to light incident upon the SIT element 1-1.1. In this way, after output signals corresponding to light inputs for the vertical scanning line 2-1 are read out successively from respective SIT elements 1-1.1, 1-1.2, ... the following vertical scanning line 2-2 is selected by the signal $\emptyset S_2$ shown in FIG. 2b from the vertical register so that signals $\emptyset G_1$, $\emptyset G_2$... generated from the horizontal register shown in FIGS. 2c and 2d drive respective SIT elements 1-2.1, 1-2.2 ..., source and drain electrodes of which are biased by the vertical scanning line 2-2 in the same manner as the above, and thus outputs of the SIT elements are successively read out. Same operations are successively repreated thereby obtaining required image pickup output.

In the conventional solid state image pickup device described above the signal reading out and signal resetting can simultaneously be performed for respective SIT elements constituting the picture cell so that only the shutter speed of a certain period determined by a scanning period from the time at which the given SIT element 1-1.1 is selected to the time at which the same SIT element 1-1.1 is again selected can be obtained. Under the condition that for example the line selection switch 4-1 is conductive by the signal $\emptyset S_1$ thereby supplying the voltage of the supply source 6 to the vertical scanning line 2-1, when the signal $\emptyset G_1$ is supplied to the horizontal scanning line 3-1 a part of charges stored in the gate capacitance $C_g$ corresponding to an amount of incident light for other SIT element 1-2.1 which is not selected on the same horizontal scanning line 3-1 is discharged through the source electrode thereof. In the television image pickup SIT elements of about 500 lines are arranged so that a releasing amount of light charges caused by such discharge at lower line can not be ignored and thus this leads to uneven or blur picture.

As a circuit construction of the solid state image pickup device using SIT element different from the above conventional device the construction shown in FIG. 3 is also considered. This construction is the same as that shown in FIG. 1 except that the light receiving portion (gate) of the SIT element corresponding to each picture cell is made floating condition as shown in FIG. 3 and the drain electrode of SIT elements is connected to the horizontal scanning line, so that the timing of drive pulse is also the same as that shown in FIG. 2.

In the construction shown in FIG. 3 charges generated by light input are stored in the gate capacitance of the gate electrode of respective SIT elements and the charges of one SIT element selected by signals $\emptyset G_1$, $\emptyset G_2$, ... from the horizontal register in the SIT elements selected by the signals $\emptyset S_1$, $\emptyset S_2$, ... from the vertical register are read out as an image pickup output corresponding to light charges stored by the application of the signals $\emptyset G_1$, $\emptyset G_2$, ... and delivered from the output terminal 8. In FIG. 3 the same elements as that shown in FIG. 1 are given like reference characters.

In the embodiment shown in FIG. 1 when the horizontal scanning signal $\emptyset G_n$ (n=1, 2, ...) is supplied the stored light charges flow from the gate electrode to the source electrode of the SIT element corresponding to the cell on the same horizontal scanning line 3-1, 3-2, ... other than the selected picture cell, but in the embodiment shown in FIG. 3, as long as the source electrode of the SIT element is not selected by the line selection switch 4-1, 4-2, ... the charges stored in the gate electrode of the SIT element do not flow so that the image pickup output having no light blur may be obtained which is more advantageous than that of the previous device.

On the other hand, however, respective SIT elements shown in FIG. 3 can not release the charges stored in the gate electrode and generated by light. For example, in the solid state image pickup device comprising n channel SIT elements the holes in the gate electrode can not be released. Such structure can not be subjected to practical use without adding further improvement.

In order to image-pickup a moving object clearly, generally, it has to photograph the object with a shutter speed corresponding to the moving speed of the object and thus the shutter speed must be set to an optical time between 1/1000 sec and few seconds. In a television camera having a conventional image pickup tube, the NTSC system obtains image pickup signals as an output while performing the interlacing scanning at the frequency of 60 Hz per one field scan so that the photoelectric conversion surface of the image pickup tube must be charged up every 1/60 sec and thus the shutter speed lower than 1/60 sec can not be obtained. In the conventional device, for example, use is made of a mechanical shutter in front of the image pickup tube in order to obtain the shutter speed larger than 1/60 sec.

In the solid state image pickup device, for example, the television camera comprising CCD's, the electronic shutter function can easily be obtained by making charge storage time due to photoelectric conversion function variable and then the shutter speed can be optionally set by the external electric signals. The present invention is based of the above points.

SUMMARY OF THE INVENTION

It is an object of the present invention to eliminate the above described disadvantages of the conventional solid state image pickup device.

It is another object of the present invention to provide a solid state image pickup device capable of picking up a moving object with high sensitivity and sharpness by adding an electronic shutter function to the solid state image pickup device comprising SIT elements as a solid state image pickup element.

According to the present invention there is provided a solid state image pickup device comprising a plurality of picture cells each having a static induction transistor and arranged in a matrix, means for scanning the picture cells in the horizontal and vertical directions, means for generating scanning pulses which drive the vertical and horizontal scanning means, means for reading out light signal stored in the picture cells, means for resetting the picture cells, first means connected to one end of the vertical scanning means for optionally and selectively connecting the vertical scanning means to the vertical scanning pulse generating means, second means connected to the other end of the vertical scanning means for optionally and selectively connecting the vertical scanning means to the cell reset means, means for generating reset scanning pulses which drive the second means, and means connected to the reset scanning pulse generating means for optionally setting in one frame period the timing of reset scanning pulses generated from the reset scanning pulse generating means.

BRIEF DESCRIPTION OF THE DRAWINGS

FIG. 1 is a circuit diagram showing one example of the conventional solid state image pickup device comprising SIT elements;

FIG. 2 is a waveform chart showing the timing of respective signals for driving the device shown in FIG. 1;

FIG. 3 is a circuit diagram showing another example of the conventional solid state image pickup device comprising SIT elements;

FIG. 4 is a circuit diagram showing one embodiment of a solid state image pickup device comprising SIT elements according to the present invention;

FIG. 5 is a waveform chart explaining the timing relation of respective drive signals for the device shown in FIG. 4.

DETAILED EXPLANATION OF THE PREFERRED EMBODIMENTS

Figure 6:
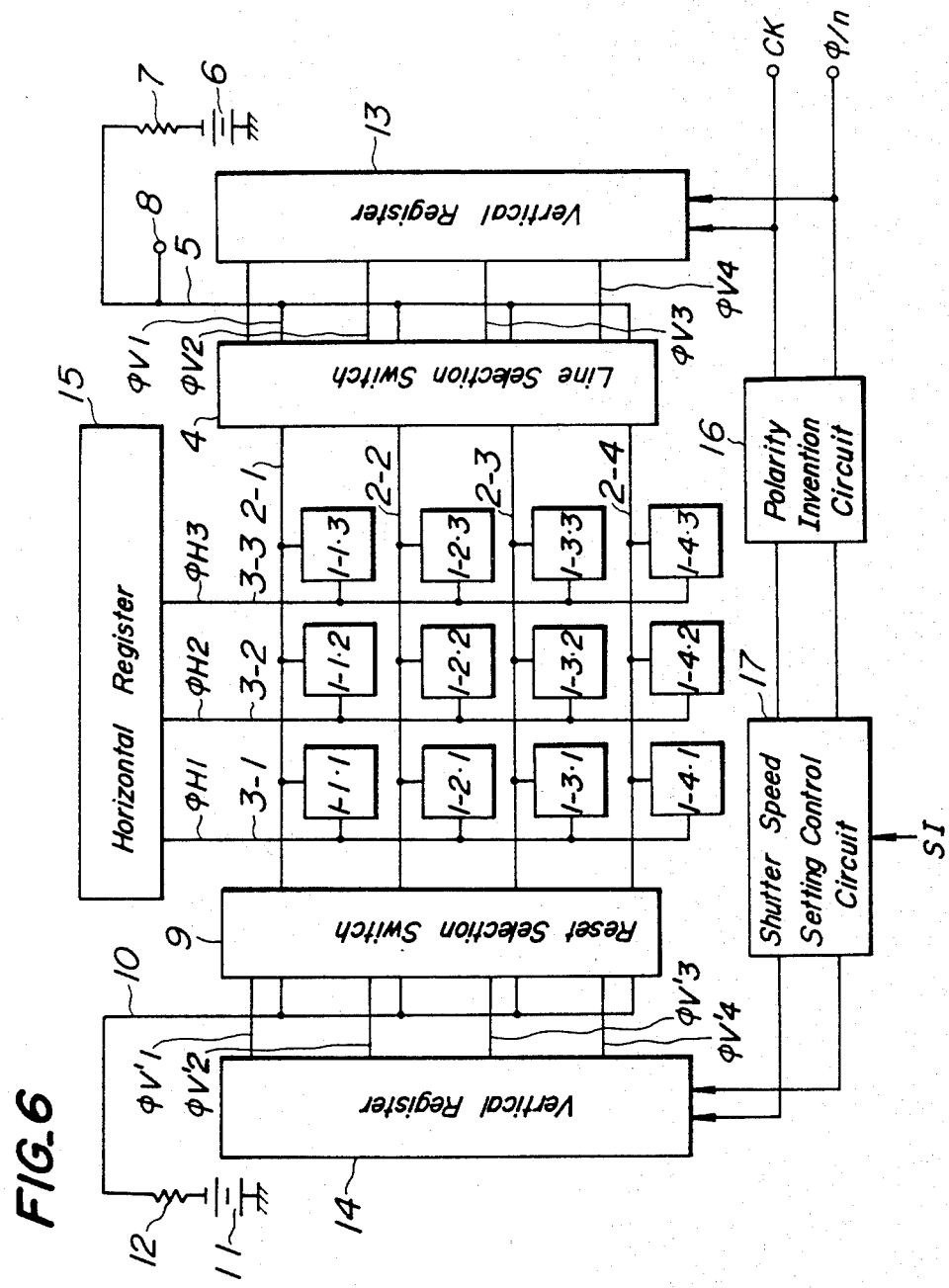
FIG. 6 is a circuit diagram showing concrete structure of the solid state image pickup device shown in FIG. 4.

Referring now to FIG. 4 one embodiment of a solid state image pickup device according to the present invention will be explained.

As shown in FIG. 4 respective SIT elements 1-1.1, 1-1.2, ..., 1-2.1, 1-2.2, ..., 1-n.1, 1-n.2, ... are arranged in a matrix and gate electrodes of respective SIT elements are made floating condition. Each SIT element constitutes an elementary picture cell. Respective SIT elements are interposed between vertical scanning lines 2-1, 2-2, ..., 2-n and horizontal scanning lines 3-1, 3-2, ... in such a manner that the source electrode of the SIT element is connected to the horizontal scanning line and the drain electrode of the SIT element is connected to the vertical scanning line between respective horizontal and vertical scanning lines.

Respective horizontal scanning lines 3-1, 3-2, ... successively receive horizontal pulse signals $\emptyset H_1$, $\emptyset H_2$, ... from a conventional horizontal register (not shown). The vertical scanning lines 2-1, 2-2, ..., 2-n are connected to a readout signal line 5 through respective line selection switches 4-1, 4-2, ..., 4-n which are successively made conductive by vertical scanning signals $\emptyset V_1$, $\emptyset V_2$, ... $\emptyset V_n$ having duration equal to one line scanning period from the vertical register (not shown). The signal line 5 receives a readout signal from a readout voltage supply source 6 through a load resistor 7.

The vertical scanning lines 2-1, 2-2, ..., 2-n are connected at its other end to a reset signal line 10 through reset switches 9-1, 9-2, ..., 9-n each having a channel structure opposite to that of SIT element forming the picture cell and the line selection switch. The signal line 10 receives reset signals from a reset voltage supply source 11 through a load resistor 12. The reset signal line 10 and the readout signal line 5 are biased to the positive and the negative biasing potentials by the reset supply source 11 and the readout voltage supply source 6, respectively.

In the above construction, when the vertical scanning signal $\emptyset V_1$ is supplied to the gate electrode of the line selection switch 4-1 from the vertical register (not shown) the switch 4-1 becomes conductive so that respective drain electrodes of the SIT elements 1-1.1, 1-1.2, ... which are connected to the horizontal scanning line 2-1 are connected to the readout signal line 5. Under such a condition when vertical scanning signals $\emptyset H_1$, $\emptyset H_2$, ... are successively supplied to respective horizontal scanning lines 3-1, 3-2, ... from the horizontal register (not shown) source electrodes of respective SIT elements are connected to the horizontal scanning lines 3-1, 3-2, ... so that the readout signal line 5 supplies light signal in accordance with the storage time of light input of respective SIT elements 1-1.1, 1-1.2, ... as an output. At the completion of this horizontal line scanning the vertical scanning signal $\emptyset V_2$ is supplied to the line selection switch 4-2 from the vertical register thereby rendering it conductive. In the same way the horizontal scanning signals $\emptyset H_1$, $\emptyset H_2$, ... are successively supplied to respective horizontal scanning line 3-1, 3-2, ... from the horizontal register so that output signals corresponding to light input are successively read out from SIT elements 1-2.1, 1-2.2, . . . in the horizontal scanning direction. In this way signal reading out of whole vertical scanning lines 2-1 to 2-n is completed resulting in a completion of one field scanning. In this case the image picked-up outputs are derived from an output terminal 8 as a video signal.

Now, a reset of the first vertical scanning line 2-1 is explained hereinafter in case of performing signal readout through for example n-th vertical scanning line 2-n during such a field scanning period. A reset signal $\phi V_1'$ is generated from a vertical register for signal reset (not shown) in synchronism with the vertical scanning signal $\phi V_n$ supplied to the line selection switch 4-n of the vertical scanning line 2-n and the reset selection switch 9-1 is made conductive state by the reset signal $\phi V_1'$ so that output signals corresponding to light input from SIT elements 1-n.1, 1-n.2, . . . connected to the vertical scanning line 2-n can be obtained from the readout signal line 5 through the vertical scanning line 2-n and the line selection switch 4-n according as the horizontal scanning signals $\phi H_1, \phi H_2$, . . . are supplied to the horizontal scanning lines 3-1, 3-2, . . . from the horizontal register. While in SIT elements 1-1.1, 1-1.2, . . . having drain electrodes connected to the reset selection switch 9-1 becoming conductive by the reset signal $\phi V_1'$ the holes as light charges stored in a gate capacitance $C_g$ from the time a previous light signal is read out to the time the reset selection switch 9-1 is conductive, are delivered to the reset signal line 10 through the reset selection switch 9-1. In this manner the reset of SIT elements 1-1.1, 1-1.2, . . . is performed at timing of supplying horizontal scanning signals $\phi H_1, \phi H_2$, . . . to respective horizontal scanning lines 3-1, 3-2, . . . . To this end each SIT element has to detect electron flow at signal readout time and to flow holes at reset time so that it is necessary to use as reset selection switch 9-1 to 9-n a selection switch having polarity opposite to that of SIT elements 1-1.1 to 1-n.n formed as a picture cell and line selection switches 4-1 to 4-n.

FIG. 5 shows waveforms of respective drive signals used in the above embodiment. FIGS. 5a, 5b and 5c show waveforms of vertical scanning signals $\phi V_1, \phi V_2$ . . . $\phi V_n$, respectively, delivered from the vertical register (not shown) for driving line selection switches 4-1, 4-2, . . . , 4-n, and FIGS. 5d and 5e show waveforms of reset signals $\phi V_1'$ and $\phi V_2'$ supplied to reset selection switches 9-1, 9-2, from the reset vertical register (not shown). In this embodiment as shown in FIG. 5 reset signals $\phi V_1', \phi V_2'$ have the polarity opposite to that of vertical scanning signals $\phi V_1, \phi V_2$. FIGS. 5f and 5g show horizontal scanning signals $\phi H_1, \phi H_2$ supplied to respective horizontal lines 3-1, 3-2, respectively. That is, readout of respective SIT elements in n-th vertical scanning line 2-n due to the vertical scanning signal $\phi V_n$ shown in FIG. 5c and reset of respective SIT elements in first vertical scanning line 2-1 due to the reset signal $\phi V_1'$ shown in FIG. 5d are simultaneously and successively performed by horizontal scanning signals $\phi H_1$ and $\phi H_2$ shown in FIGS. 5f and 5g and then the amount of charges stored during a period $T_1$ from the reset instant $t_1$ to the instant $t_2$ the first vertical scanning line 2-1 is scanned by the vertical scanning signal $\phi V_1$ shown in FIG. 5a and the horizontal scanning signal $\phi H_1$ shown in FIG. 5f. In this manner, signal readout of respective vertical scanning lines 2-1 to 2-n can successively be performed. In FIG. 5 reference F shows a field scanning period and reference L shows a horizontal scanning period. In the conventional device shown in FIG. 1 the storage time $T_1$ is locked to the field period, but in the present embodiment respective reset selection switches 9-1 to 9-n can successively be made conductive at any timing in synchronism with respective line selection switches 4-1 to 4-n so that any shutter speed $T_2$ which is an integer multiple of the vertical scanning line switching period can be set. Moreover, light storage time of respective SIT elements is uniform so that image pickup signals corresponding to uniform light input can be obtained even though the shutter speed is changed.

FIG. 6 shows a block diagram illustrating concrete construction of the solid state image pickup device according to the present invention shown in FIG. 3. In FIG. 6 the same elements as that shown in FIG. 3 are given like reference characters.

That is, reference 4 is a group of line selection switches for signal readout which are controlled by vertical scanning signals generated from a vertical register 13. Reference numeral 9 is a group of reset selection switches which are controlled by reset signals generated from another vertical register 14. Reference numeral 15 is a horizontal register which is so constructed that horizontal scanning signals are supplied to respective horizontal scanning lines 3-1 to 3-3. Respective vertical registers 13, 14 are so constructed that they generate vertical scanning signal and reset signals each having opposite polarity to each other required to actuate the line selection switch group 4 and the reset selection switch group 9 and these signals are simultaneously supplied to line selection switches and reset selection switches on the vertical scanning line placed at positions which are separated by time difference corresponding to the required shutter speed. To this end line synchronizing signal $\phi/n$ and control clock pulse signal CK are supplied to the vertical register 13 for generating vertical scanning signal and supplied to the vertical register 14 for generating reset signal through a polarity inversion circuit 16 and a shutter speed setting control circuit 17, so that reset selection switches on respective vertical scanning lines which are addressed by a shutter speed addressing signal S1 supplied to the shutter speed setting control circuit 17, are controlled by reset signals generated from the vertical register 14. These signals may be directly supplied to the registers from an external circuit.

According to the present invention, as seen from the above description use is made of SIT elements as a solid state image pickup element forming a picture cell so that light sensitivity becomes superior and any shutter speed of 1/1000 or more equal to an integer multiple of the line scanning period as a unit time can be obtained. If the solid state image pickup device according to the present invention is applied to the television camera or the still camera the fast moving object can be photographed with high speed shutter so that time resolution can be improved and thus preferably reproduced picture can be obtained.

In the above embodiment when the signals are read out by X-Y addressing system the vertical scanning lines ae successively changed over by the line selection switch, but image pickup signals may be delivered as an output in accordance with an interlaced scanning system by adding a change-over switch for selecting even number lines and odd number lines to the line selection switch and selecting odd number lines at first field period and even number lines at the next field period.

What is claimed is:

1. A solid state image pickup device comprising a plurality of picture cells each having a static induction transistor and arranged in a matrix, means for scanning the picture cells in the horizontal and vertical directions, means for generating scanning pulses which drive the vertical and horizontal scanning means, means for reading out light signal stored in the picture cells, means for resetting the picture cells, first means connected to one end of the vertical scanning means for optionally and selectively connecting the vertical scanning means to the vertical scanning pulse generating means, second means connected to the other end of the vertical scanning means for optionally and selectively connecting the vertical scanning means to the cell reset means, means for generating reset scanning pulses which drive the second means, and means connected to the reset scanning pulse generating means for optionally setting in one frame period the timing of reset scanning pulses generated from the reset scanning pulse generating means.

2. A solid state image pickup device as claimed in claim 1, wherein the vertical and horizontal scanning means are a plurality of vertical scanning lines and a plurality of horizontal scanning lines, respectively.

3. A solid state image pickup device as claimed in claim 1, wherein the scanning pulse generating means are a first vertical register and a horizontal register, respectively.

4. A solid state image pickup device as claimed in claim 1, wherein the light signal readout means is a readout signal line connected to the vertical scanning lines.

5. A solid state image pickup device as claimed in claim 1, wherein the cell reset means is a reset signal line connected to the vertical scanning lines.

6. A solid state image pickup device as claimed in claim 3, wherein the first means is a line selection switch having a plurality of electronic switches which are controlled by the first vertical register.

7. A solid state image pickup device as claimed in claim 1, wherein the second means is a reset selection switch having a plurality of electronic switches.

8. A solid state image pickup device as claimed in claim 1, wherein the reset scanning pulse generating means is a second vertical register for controlling electronic switches of the reset selection switch.

9. A solid state image pickup device as claimed in claim 1, wherein the means for generating the timing of reset pulses is a shutter speed control circuit connected between the first vertical register and the second vertical register.

10. A solid state image pickup device as claimed in claim 1, wherein source electrode or drain electrode of the static induction transistor is connected to the horizontal scanning lines, the drain electrode or source electrode of the transistor is connected to the vertical scanning lines, the gate electrode is made floating condition, and the readout signal line and the reset signal line are commonly connected to the vertical scanning line through the line selection switch and the reset selection switch, respectively.

* * * * *